(12) United States Patent
Sasaki et al.

(10) Patent No.: US 9,030,589 B2
(45) Date of Patent: May 12, 2015

(54) IMAGE SENSOR AND IMAGE SENSING APPARATUS

(75) Inventors: Ken Sasaki, Tokyo (JP); Nobuhiro Takeda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/127,818

(22) PCT Filed: Aug. 7, 2012

(86) PCT No.: PCT/JP2012/070584
§ 371 (c)(1),
(2), (4) Date: Dec. 19, 2013

(87) PCT Pub. No.: WO2013/022111
PCT Pub. Date: Feb. 14, 2013

(65) Prior Publication Data
US 2014/0139716 A1 May 22, 2014

(30) Foreign Application Priority Data
Aug. 11, 2011 (JP) ................................. 2011-176333

(51) Int. Cl.
*H04N 3/14* (2006.01)
*H04N 5/335* (2011.01)
*H04N 5/232* (2006.01)
*H04N 5/359* (2011.01)
*H04N 5/355* (2011.01)
*H04N 5/3745* (2011.01)
*H01L 27/146* (2006.01)

(52) U.S. Cl.
CPC .......... *H04N 5/359* (2013.01); *H01L 27/14621* (2013.01); *H01L 27/14627* (2013.01); *H01L 27/14641* (2013.01); *H04N 5/355* (2013.01); *H04N 5/3559* (2013.01); *H04N 5/3745* (2013.01)

(58) Field of Classification Search
CPC .................................................... H04N 5/3696
See application file for complete search history.

(56) References Cited

U.S. PATENT DOCUMENTS 5,237,185 A     8/1993  Udagawa et al.
6,452,153 B1 *  9/2002  Lauxtermann et al. ....... 348/302

(Continued)

FOREIGN PATENT DOCUMENTS

JP    2001-250931 A    9/2001
JP    2007-325139 A   12/2007

(Continued)

*Primary Examiner* — Jason Flohre
(74) *Attorney, Agent, or Firm* — Fitzpatrick, Cella, Harper & Scinto

(57) ABSTRACT

An image sensor comprises a plurality of pixels, and each pixel having: a plurality of photoelectric conversion units configured to receive light fluxes that pass through different exit pupil regions of an optical system disposed on an object side of the image sensor and accumulate charges, respectively; a separation portion configured to separate the photoelectric conversion units; and setting means configured to selectively set an electric potential of the separation portion to any one of a plurality of electric potentials. Signals can be separately read out from the photoelectric conversion units. Taking an electric potential of a separation portion that separates the plurality of pixels as a reference potential, the plurality of electric potentials include first to third electric potentials; higher than the reference potential, lower than the reference potential, and higher than the reference potential and lower than the first electric potential.

6 Claims, 13 Drawing Sheets

(56) References Cited

U.S. PATENT DOCUMENTS

| | | | |
|---|---|---|---|
| 7,745,857 B2 * | 6/2010 | Okumura et al. | 257/292 |
| 8,159,580 B2 | 4/2012 | Suzuki et al. | |
| 8,319,874 B2 | 11/2012 | Suzuki | |
| 8,570,415 B2 | 10/2013 | Takeda | |
| 8,582,009 B2 | 11/2013 | Kono et al. | |
| 8,692,917 B2 | 4/2014 | Takeda | |
| 2009/0086063 A1 * | 4/2009 | Suzuki et al. | 348/241 |
| 2009/0290059 A1 * | 11/2009 | Suzuki | 348/308 |

FOREIGN PATENT DOCUMENTS

| | | |
|---|---|---|
| JP | 2008-193527 A | 8/2008 |
| JP | 2011-107614 A | 6/2011 |
| JP | 2011-123133 A | 6/2011 |

* cited by examiner

F I G. 7A
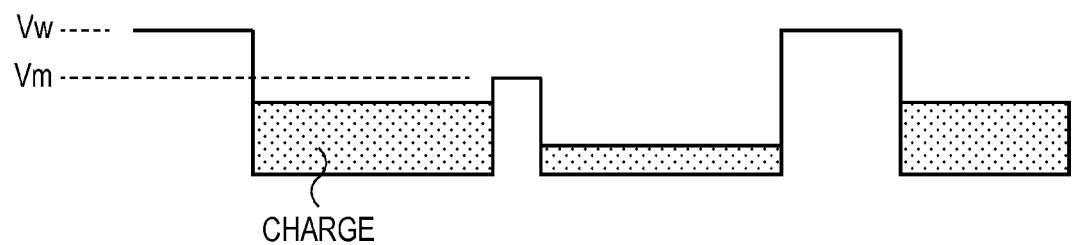
F I G. 7B
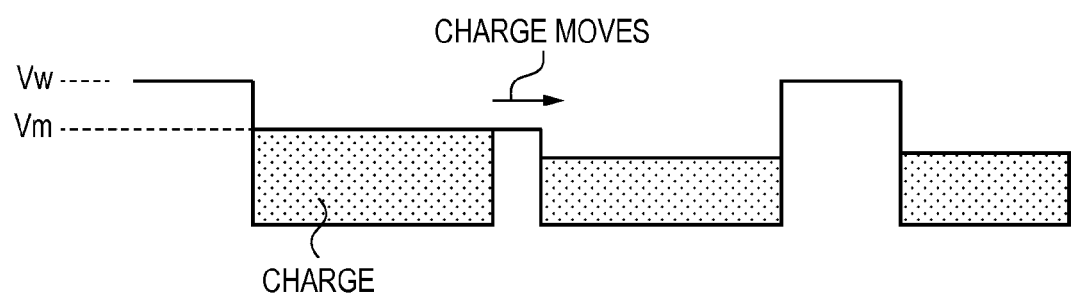
F I G. 7C
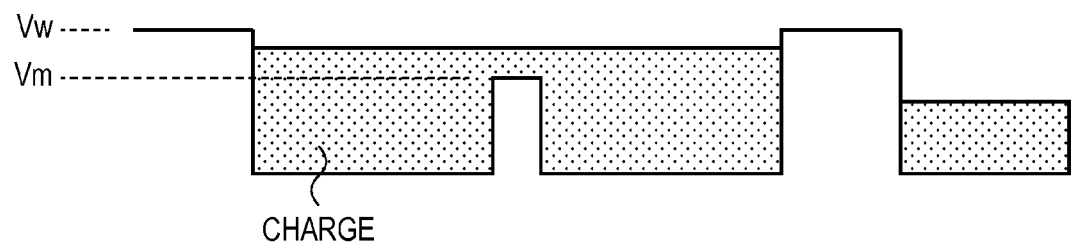

IMAGE SENSOR AND IMAGE SENSING APPARATUS

TECHNICAL FIELD

The present invention relates to an image sensor and an image sensing apparatus.

BACKGROUND ART

Conventionally, in at least some pixels constituting an image sensor, each pixel is configured so as to have a plurality of photodiodes (PDs), and a signal is read out separately from each PD. Technology exists that separately reads out signals from a plurality of PDs, the signals being in accordance with light converged by a single microlens provided in each pixel, and performs focus detection by a phase difference detection method using the read signals of the pixels. For example, Japanese Patent Laid-Open No. 2008-193527 discloses technology in which, by configuring a pixel to have two PDs, the respective PDs are configured so as to receive light fluxes that passed through different exit pupil regions of an image sensing lens. According to the aforementioned technology, focus detection of the image sensing lens is performed by comparing signals obtained from two PDs of each of a plurality of pixels.

Further, Japanese Patent Laid-Open No. 2001-250931 discloses a driving method that performs focus detection by comparing signals obtained from two PDs of each of a plurality of pixels, and further, adds together the signals of the two PDs for each pixel to thereby acquire the added signal as a signal for an image. That is, a single driving operation to perform charge accumulation of divided PDs and read out accumulated charge signals serves as an operation for both acquisition of a signal for focus detection and acquisition of a signal for an image. Accordingly, this driving method is effective in the case of a function in which display and recording at high speed are required while maintaining a focused state of an object, such as when performing sequential imaging of still images, live-view imaging, or video recording.

However, when adding signals of a plurality of PDs to obtain a signal for an image, in some cases an appropriate image cannot be obtained if there is a difference in the sensitivity or incident light amount between the PDs. Such a case will now be described using FIG. 13A, FIG. 13B, and FIG. 14.

FIG. 13A is a view showing a cross-sectional configuration of a pixel of a conventional image sensor. FIG. 13B is a view that schematically illustrates the potential of a semiconductor layer. In FIG. 13A, reference numeral 1401 denotes a microlens, reference numeral 1402 denotes a color filter, and reference numeral 1403 denotes wiring for driving switches inside the pixel and wiring of a power source or the like. A p-type semiconductor region 1405 is formed on a semiconductor substrate 1404, and an n-type region is formed in the semiconductor substrate 1404, by which region a PD is formed. In this case, a PD 1406 and a PD 1407 are formed. Reference numeral 1408 denotes a separation area that separates adjacent pixels. Reference numeral 1409 denotes a separation area that separates PDs that are formed in the same pixel (in this case, the separation area separates the PD 1406 and the PD 1407).

In an image sensor having the above described structure, due to a difference in the sensitivity or an incident light amount, when one of the PDs is saturated, an electrical charge generated at the saturated PD flows over a barrier of a potential (Vw), and leaks to the other PD in the same pixel or to a PD of an adjacent pixel. Furthermore, in some cases the charge may flow over a potential barrier below a gate electrode of an unshown transfer switch that is present between the PD and a region for reading out a charge of the PD, and also leak to the region for reading out a charge of the PD. Conventionally, since the size of the potential (height of the potential barrier) of the separation areas 1408 and 1409 is not taken into consideration, it is assumed that normally a large part of the charge of the saturated PD leaks to a PD of an adjacent pixel or to a region for reading out a charge of the PD. In a case in which the potential of the separation area 1409 is a potential such that a charge generated at the saturated PD does not leak to the other PD in the pixel in this manner, when the signals of the two PDs are added to obtain a signal for an image, the outputs are as shown in FIG. 14.

FIG. 14 shows an example of the output characteristics of the two PDs 1406 and 1407, respectively, and an example of the output characteristic of a signal obtained by adding signals of the two PDs 1406 and 1407. When light is incident on a PD, an electric charge is generated with a certain sensitivity by photoelectric conversion, and the charge is accumulated. In FIG. 14, for the purpose of description, it is assumed that the sensitivity of the PD 1406 is higher than that of the PD 1407, and/or a larger amount of light is incident on the PD 1406. During a period in which the amount of light incident on the PDs 1406 and 1407 is within a range 1501, although the output of the PD 1406 is greater than that of the PD 1407, since the PD 1406 is not saturated, an appropriate output is obtained by adding the outputs of the PD 1406 and the PD 1407. However, when the PD 1406 saturates and the PD 1407 is not saturated, an output that is greater than the saturated amount cannot be obtained as the output of the PD 1406, whereas an appropriate output that is in accordance with the amount of incident light is obtained at the PD 1407. Consequently, from the time point that the PD 1406 saturates, the added output changes in accordance with the output of the PD 1407. As a result, the curve of the added output characteristic has a knee characteristic that bends from the point at which the PD 1406 saturates. This phenomenon noticeably appears when a charge generated after the PD 1406 is saturated leaks to an area other than the PD 1407.

SUMMARY OF INVENTION

The present invention has been made in consideration of the above situation, and the present invention makes it possible to change the height of a potential barrier of a separation area that separates photoelectric conversion units in a single pixel so that movement of charges generated at each of a plurality of photoelectric conversion units can be controlled.

In addition, the present invention suppresses leakage of a charge to an adjacent pixel in a case where any photoelectric conversion unit inside a single pixel is saturated.

According to the present invention, provided is an image sensor comprising a plurality of pixels, each pixel having: a plurality of photoelectric conversion units configured to receive a plurality of light fluxes that pass through different exit pupil regions of an optical system that is disposed on an object side of the image sensor and accumulate charges, respectively; a separation portion configured to separate the plurality of photoelectric conversion units; and setting means configured to selectively set an electric potential of the separation portion to any one of a plurality of electric potentials, wherein: signals in accordance with accumulated charges can be separately read out from the plurality of photoelectric conversion units; and when an electric potential of a separation portion that separates the plurality of pixels is taken as a reference potential, the plurality of electric potentials include a first electric potential that is higher than the reference potential, a second electric potential that is lower than the reference potential, and a third electric potential that is higher than the reference potential and lower than the first electric potential.

According to another aspect of the present invention, provided is an image sensor comprising a plurality of pixels, each pixel having: a plurality of photoelectric conversion units configured to receive a plurality of light fluxes that pass through different exit pupil regions of an optical system disposed on an object side of the image sensor and accumulate charges, respectively; a first separation portion configured to separate the plurality of photoelectric conversion units; and a second separation portion configured to separate the respective pixels from a pixel adjacent to the relevant pixel, wherein: an electric potential of the first separation portion is higher than an electric potential of the second separation portion and is lower than a reset potential of the plurality of photoelectric conversion units; and signals in accordance with accumulated charges can be separately read out from the plurality of photoelectric conversion units.

Furthermore, according to still another aspect of the present invention, provided is an image sensing apparatus, comprising: an image sensor as described above; and focus detection means configured to perform focus detection by a phase difference detection method using signals that are based on charges that are separately read out from the plurality of photoelectric conversion units, wherein when at least any one of the plurality of photoelectric conversion units is saturated, the focus detection means does not use signals that are read out from a plurality of photoelectric conversion units of a pixel that includes the saturated photoelectric conversion unit for the focus detection.

Further features of the present invention will become apparent from the following description of exemplary embodiments (with reference to the attached drawings).

BRIEF DESCRIPTION OF DRAWINGS

The accompanying drawings, which are incorporated in and constitute a part of the specification, illustrate embodiments of the invention, and together with the description, serve to explain the principles of the invention.

FIG. 7A to FIG. 7C are views that schematically show the potential of a pixel according to the embodiment as well as the manner in which a charge is accumulated;

DESCRIPTION OF EMBODIMENTS

Exemplary embodiments of the present invention will be described in detail in accordance with the accompanying drawings. First, a configuration of an image sensor according to the present embodiment is described using FIGS. 1 to 3.

Figure 1:
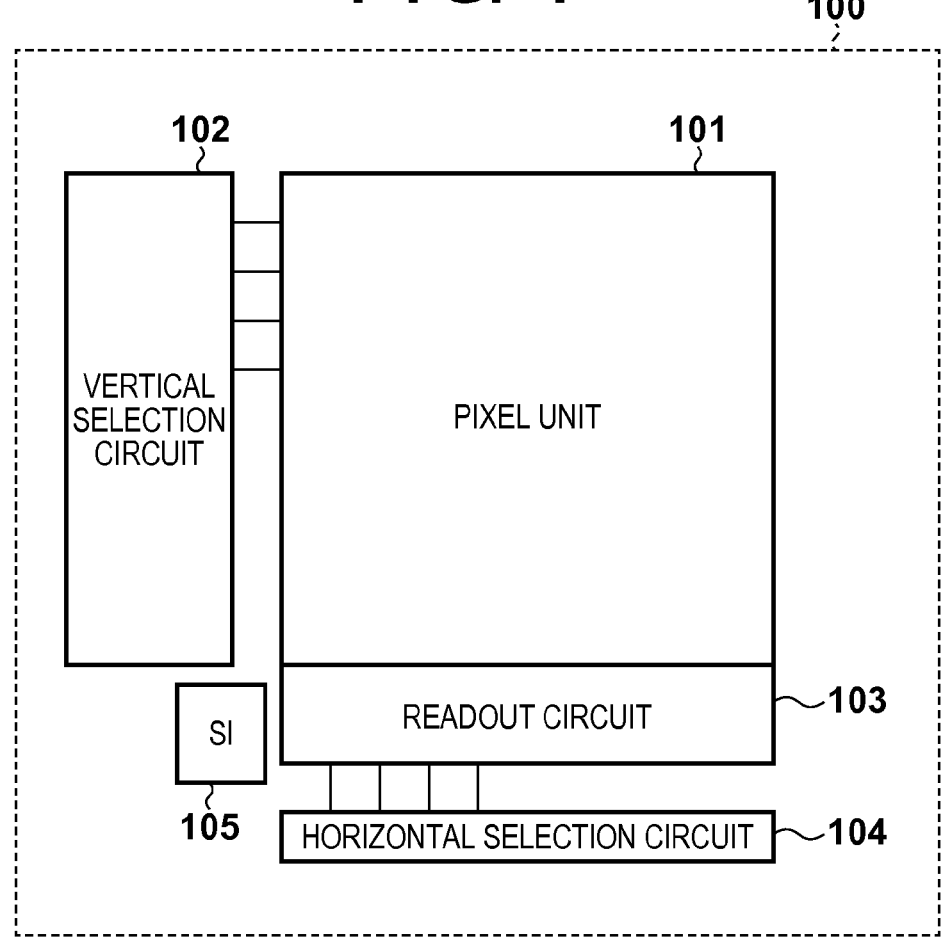
FIG. 1 is a view showing a schematic configuration of an image sensor according to an embodiment of the present invention.

FIG. 1 is a view showing a schematic configuration of an image sensor according to an embodiment of the present invention. An image sensor 100 shown in FIG. 1 includes a pixel unit 101 including a plurality of pixels that are disposed in a matrix shape, a vertical selection circuit 102 that selects a row in the pixel unit 101, and a horizontal selection circuit 104 that selects a column in the pixel unit 101. The pixel unit 101 also includes a readout circuit 103 that reads out signals of pixels selected by the vertical selection circuit 102 among the pixels of the pixel unit 101, and may also include a serial interface 105 for specifying an operation mode and the like of each circuit from outside. The readout circuit 103 has a memory that accumulates a signal, a gain amplifier, an A/D converter and the like for each column. In addition to the components shown in the drawing, the image sensor 100 may also include, for example, a timing generator or a control circuit or the like that provides timings to the vertical selection circuit 102, the horizontal selection circuit 104, the readout circuit 103 and the like. Typically, the vertical selection circuit 102 selects a row of the pixel unit 101 in sequence, and the readout circuit 103 reads out signals of the selected pixels. The horizontal selection circuit 104 selects signals of a plurality of pixels that were read out to the readout circuit 103 in sequence for each column.

Figure 2:
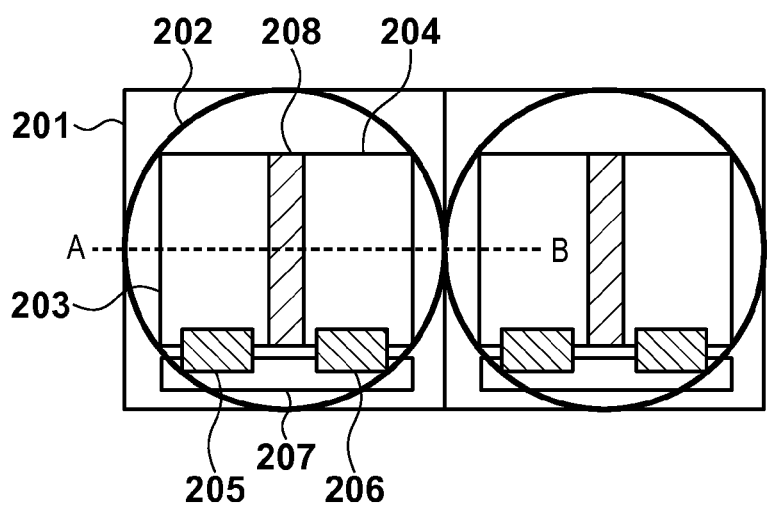
FIG. 2 is a view showing a schematic configuration of pixels according to the embodiment.

FIG. 2 is a view showing a schematic configuration of pixels included in the pixel unit 101 of the image sensor 100. Reference numeral 201 denotes a pixel. One pixel has a single microlens 202 and two photodiodes (PD) 203 and 204 that are photoelectric conversion units. The PDs 203 and 204 receive light fluxes that have passed through different exit pupil regions of an unshown image sensing lens, and generate charges in accordance with the light and accumulate the generated charges. Reference numerals 205 and 206 denote transfer switches for transferring charges that are generated and accumulated at the PDs 203 and 204, respectively, to a readout region 207. According to this configuration, charges can be read out separately from the PDs 203 and 204. Reference numeral 208 denotes a potential control switch that controls a potential of a separation area that is formed to separate the PD 203 and the PD 204 inside the single pixel 201. Control of a potential by the potential control switch 208 is described in detail later.

Note that, in addition to the components shown in the drawing, the pixel 201 includes, for example, an amplification unit for reading out a signal of the readout region 207 to the readout circuit 103, a selection switch that selects a row, and a reset switch that resets a signal of the readout region 207. Although, for description purposes, two pixels are illustrated in FIG. 2, the pixel unit 101 is formed by disposing pixels of the same configuration as the above described pixel 201 in a matrix shape.

Although an example in which the pixel 201 has two PDs (PD 203 and PD 204) is shown in FIG. 2, according to the present invention it is sufficient that the number of PDs in a pixel is two or more, and for example, a pixel may have four PDs, nine PDs or the like. Further, although two PDs are arranged in the horizontal direction in the pixel 201 shown in FIG. 2, a method of arranging the PDs is not limited thereto, and for example, the PDs may be arranged in the vertical direction. Furthermore, in the pixel unit 101, pixels in which PDs are arranged in different directions may be mixed. For example, pixels in which PDs are arranged in the vertical direction and pixels in which PDs are arranged in the horizontal direction may be mixed.

Figure 3A:
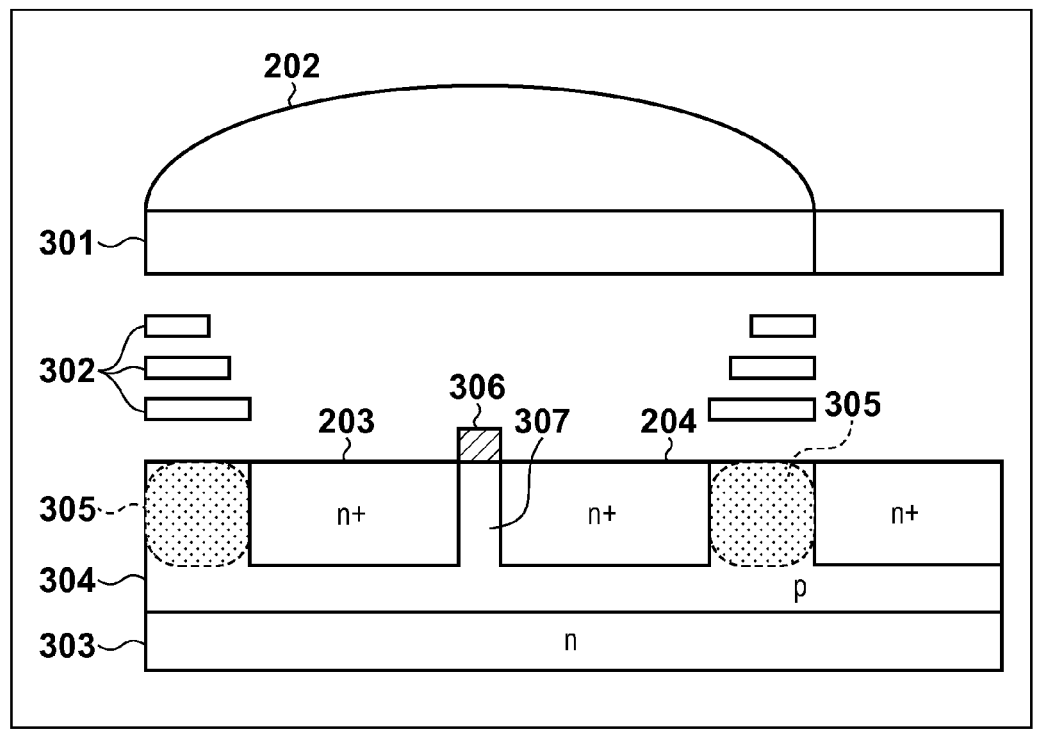
FIG. 3A and FIG. 3B are views that schematically show a cross-sectional configuration and a potential of a pixel according to the embodiment.

FIG. 3A to FIG. 5B are views that schematically show a cross-sectional configuration between a dashed line A-B shown in FIG. 2 as well as a potential along the cross section. FIG. 3A is a view showing a cross-sectional configuration of a pixel according to the embodiment of the present invention. FIG. 3B is a view showing a potential along the cross section shown in FIG. 3A. In FIG. 3A, reference numeral 301 denotes a color filter, and reference numeral 302 denotes wiring for driving switches inside the pixel and wiring of a power source or the like. A p-type region 304 is formed on a semiconductor substrate 303, and an n-type region is formed in the p-type region 304. The PDs 203 and 204 are formed by this region. Reference numeral 305 denotes a separation area for separating adjacent pixels. Reference numeral 307 denotes a separation area that separates the PD 203 and the PD 204 that are formed in the same pixel. Reference numeral 306 denotes a gate electrode of the potential control switch 208.

According to the present invention, the height of the potential of a separation area between a plurality of PDs formed in a single pixel is controlled by the potential control switch 208. According to the present embodiment, by driving a voltage applied across the gate electrode 306 of the potential control switch 208 using three values (L, M, and H levels), the potential of the separation area 307 can be selectively set to a potential of Vl, Vm, or Vh.

In this case, the L level is a voltage that controls the height of the potential barrier of the separation area 307 so as to be equal to a potential Vw of the separation area 305 or to be a potential (Vl) that is higher than the potential Vw. For example, the L level is a voltage of −1V. The H level is a voltage that controls the height of the potential barrier of the separation area 307 so as to be a potential (Vh) that is close to the potential of the PDs and in which the potential barrier disappears. For example, the H level is a voltage of 5V. The M level is a voltage that controls the height of the potential barrier of the separation area 307 so as to be a little lower than the potential Vw and also sufficiently higher than the potential Vh. For example, the M level is a voltage of 1V.

The relationship between the potential and a voltage applied across the gate electrode 306 will now be described in further detail using FIG. 3A to FIG. 5B.

Figure 3B:
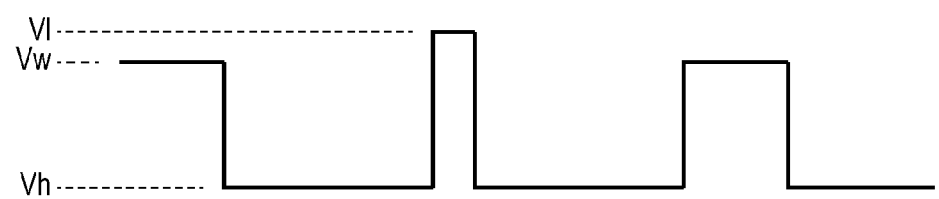

FIG. 3A and FIG. 3B schematically show a state when an L-level voltage is applied across the gate electrode 306. As shown in FIG. 3B, the potential of the separation area 305 is Vw, and the potential of the separation area 307 is Vl. The area between the PD 203 and PD 204 is in a state such that the PD 203 and the PD 204 are separated by a barrier with the potential Vl.

Figure 4A:
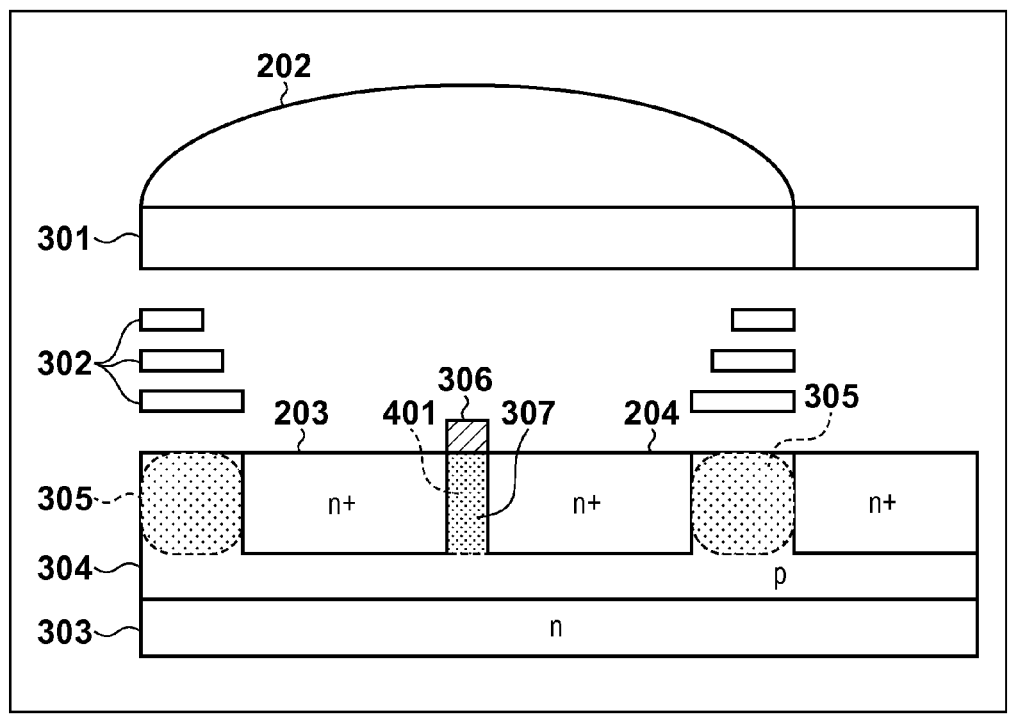
FIG. 4A and FIG. 4B are views that schematically show a cross-sectional configuration and a potential of a pixel according to the embodiment.
Figure 4B:

FIG. 4A and FIG. 4B schematically show a state when a H-level voltage is applied across the gate electrode 306. Reference numeral 401 in FIG. 4A denotes a channel region formed in the separation area 307 that is a semiconductor layer below the gate electrode 306 by application of a H-level voltage across the gate electrode 306. As shown in FIG. 4B, when the H-level voltage is applied across the gate electrode 306 and the potential of the separation area 307 becomes Vh and the channel region 401 is formed, the potential barrier disappears and the PD 203 and PD 204 enter a coupled state.

Figure 5A:
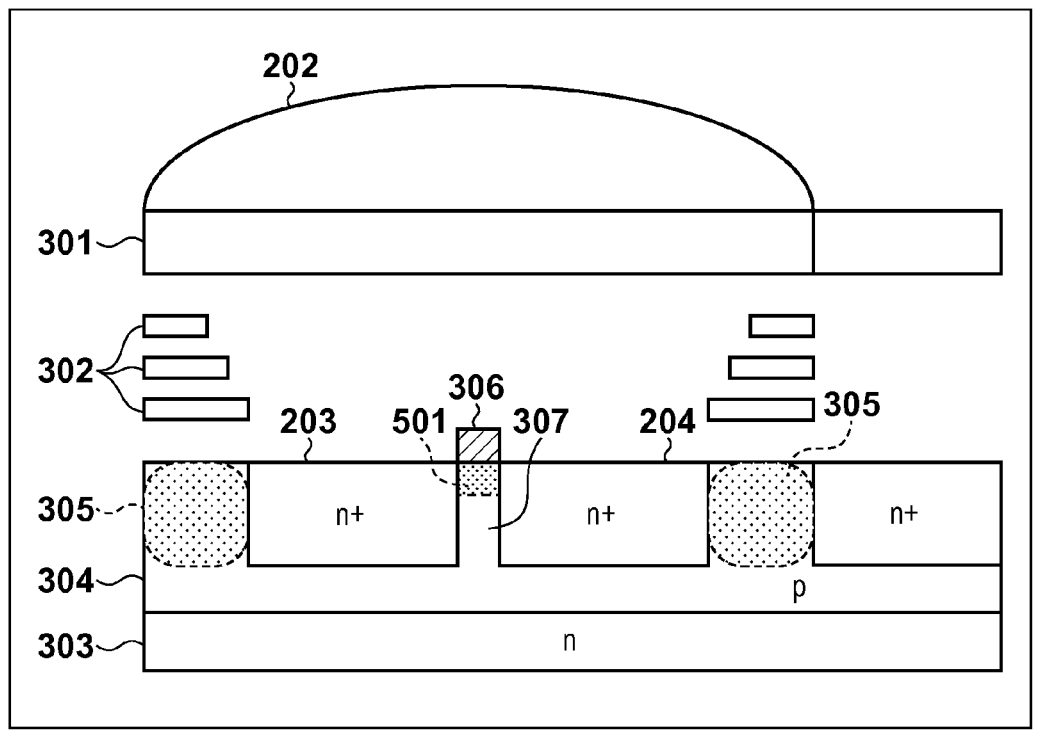
FIG. 5A and FIG. 5B are views that schematically show a cross-sectional configuration and a potential of a pixel according to the embodiment.
Figure 5B:
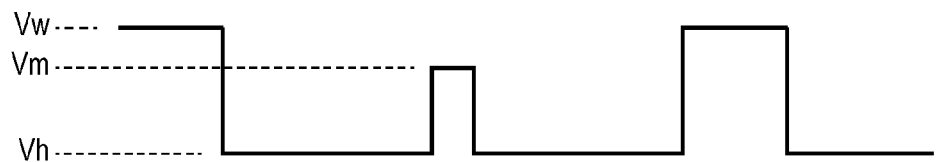

FIG. 5A and FIG. 5B schematically show a state when an M-level voltage is applied across the gate electrode 306. As shown in FIG. 5A, at this time, although a channel region 501 is formed in the separation area 307 that is the semiconductor layer below the gate electrode 306 by application of the M-level voltage, the channel region 501 is smaller than the channel region 401. In this case, the potential of the separation area 307 becomes Vm, which is a little lower than the potential Vw and is sufficiently higher than the potential Vh.

According to the present embodiment, an M-level voltage is applied across the gate electrode 306 during a charge accumulation period of the image sensor, and the height of the potential Vm of the separation area 307 is controlled so as to enter a state in which the potential Vm is a little lower than the potential Vw and sufficiently higher than the potential Vh.

Next, FIG. 6 and FIG. 7A to FIG. 7C are used to describe characteristics of outputs obtained from the two PDs 203 and 204 of the same pixel as well as an output obtained by adding the signals of the two PDs 203 and 204 in a case where the potential of the separation area 307 is controlled to the potential Vm.

Figure 6:
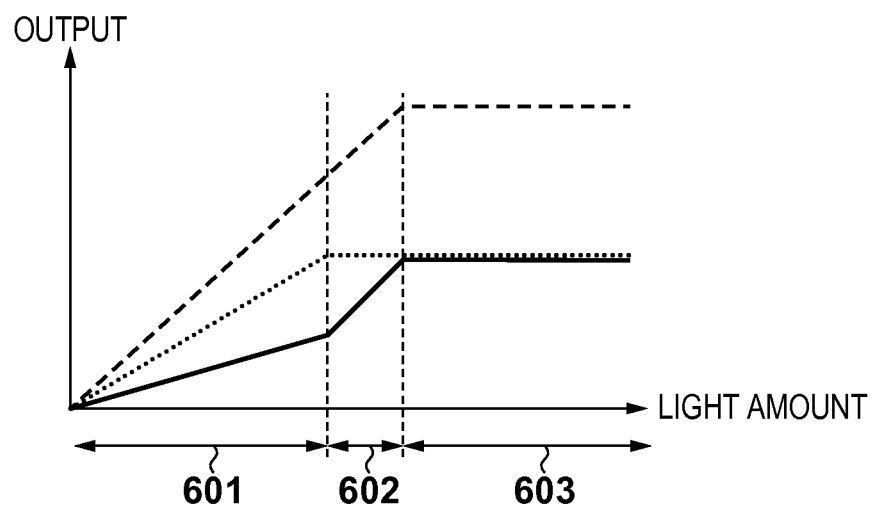
FIG. 6 is a view that schematically shows output characteristics, as well as an added output characteristic, of a plurality of photodiodes included in a single pixel in the image sensor according to the embodiment.

FIG. 6 is a view that shows an example of the respective output characteristics of the two PDs 203 and 204 as well as the characteristic of an output obtained by adding the signals of the PDs 203 and 204. Further, FIG. 7A to FIG. 7C are views that schematically show the potential structures of the potentials shown in FIG. 5B and the movement of a generated charge.

When light is incident on the PDs 203 and 204, an electric charge is generated with a certain sensitivity by photoelectric conversion, and the charge is accumulated. In FIG. 6, for the purpose of description, it is assumed that the sensitivity of the PD 203 is higher than that of the PD 204, and/or a larger amount of light is incident on the PD 203. During a period in which the amount of light incident on the PDs 203 and 204 is within a range 601, although the output of the PD 203 is greater than that of the PD 204, since the PD 203 is not saturated, an appropriate output is obtained by adding the outputs of the PD 203 and the PD 204. This state is shown in FIG. 7A. A range 602 indicates a range of incident light amounts in which the PD 203 is saturated and the PD 204 is not saturated. At this time, as shown in FIG. 7B, a charge generated at the PD 203 flows over a barrier having the potential Vm and moves to the PD 204. In this case, in the range 602, the output of the PD 204 is a charge amount obtained by adding a charge generated at the PD 204 and a charge generated at the saturated PD 203.

By controlling the potential Vm to be lower than the potential Vw in this manner, a charge generated at the saturated PD 203 can be caused to leak into the PD 204 of the same pixel. Thus, leakage of a charge generated at the saturated PD 203 to an adjacent pixel can be prevented, and furthermore, during the period that the incident light amount is within the range 602, the output obtained by adding the signals of the PD 203 and PD 204 is an appropriate output, similarly to when the incident light amount is within the range 601. In addition, when charges generated at the PDs 203 and 204, respectively, are less than or equal to the potential Vm, the outputs obtained at the PDs 203 and 204, respectively, can be used for focus detection by a phase difference detection method.

In a range 603, the PDs 203 and 204 are both saturated, and hence the added output is also saturated. Note that, although the PDs 203 and 204 are saturated with a charge amount that is defined by the potential Vm, when the two PDs are saturated, as shown in FIG. 7C, a charge can be accumulated up to the potential Vw. Therefore, the level of saturation of the actual added output increases a little.

In this connection, it has been described in the foregoing that, within the aforementioned range 602, a charge generated at the saturated PD 203 can be caused to leak into the PD 204 inside the same pixel by making the potential Vm lower than the potential Vw. Although a detailed description is not provided here, for that purpose, it is obvious that a potential below the gate electrode of the transfer switches 205 and 206 is made higher than the potential Vm.

By controlling the potential of the separation area 307 at the time of charge accumulation as described above, in a case where a PD on one side is saturated due to a difference in the sensitivity or in the incident light amounts, leakage of a charge to an adjacent pixel can be suppressed and a more appropriate image signal can be obtained. Further, when all of the PDs in a pixel are not saturated, signals read out from the respective PDs can be used for focus detection by a phase difference detection method.

Figure 8:
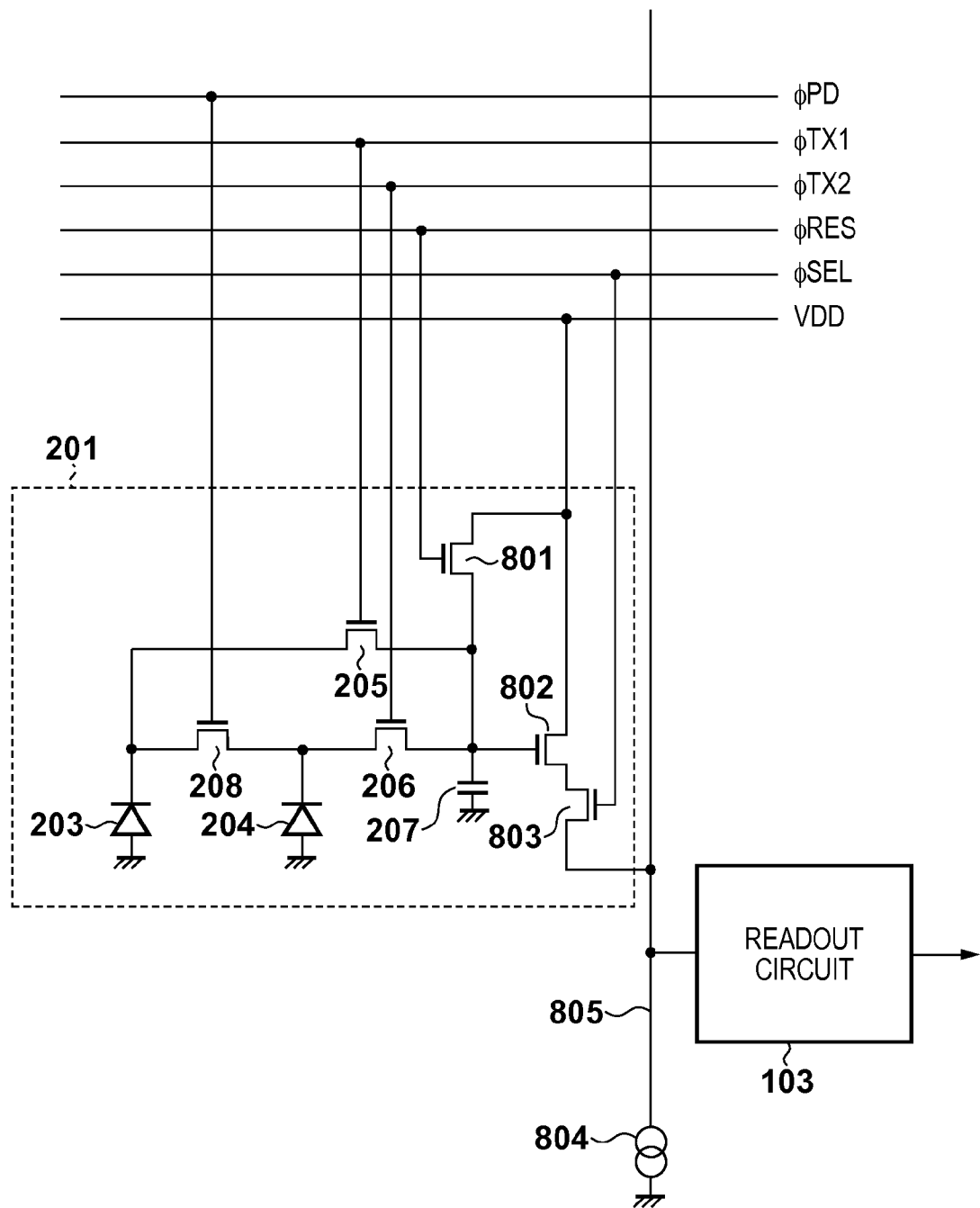
FIG. 8 is an equivalent circuit diagram of a pixel according to the embodiment.
Figure 9:
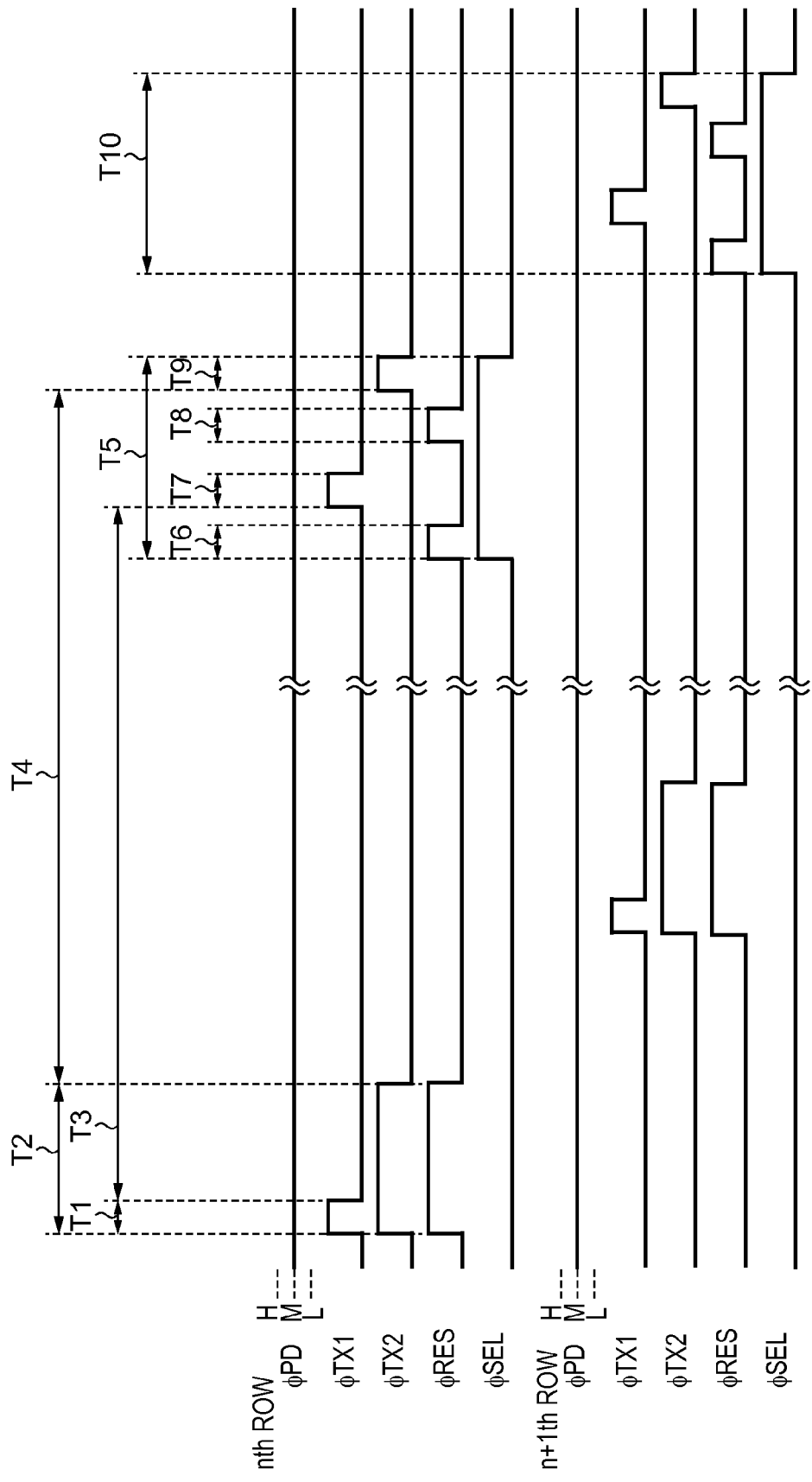
FIG. 9 is a timing chart showing an example of a driving method of the image sensor according to the embodiment.
Figure 10:
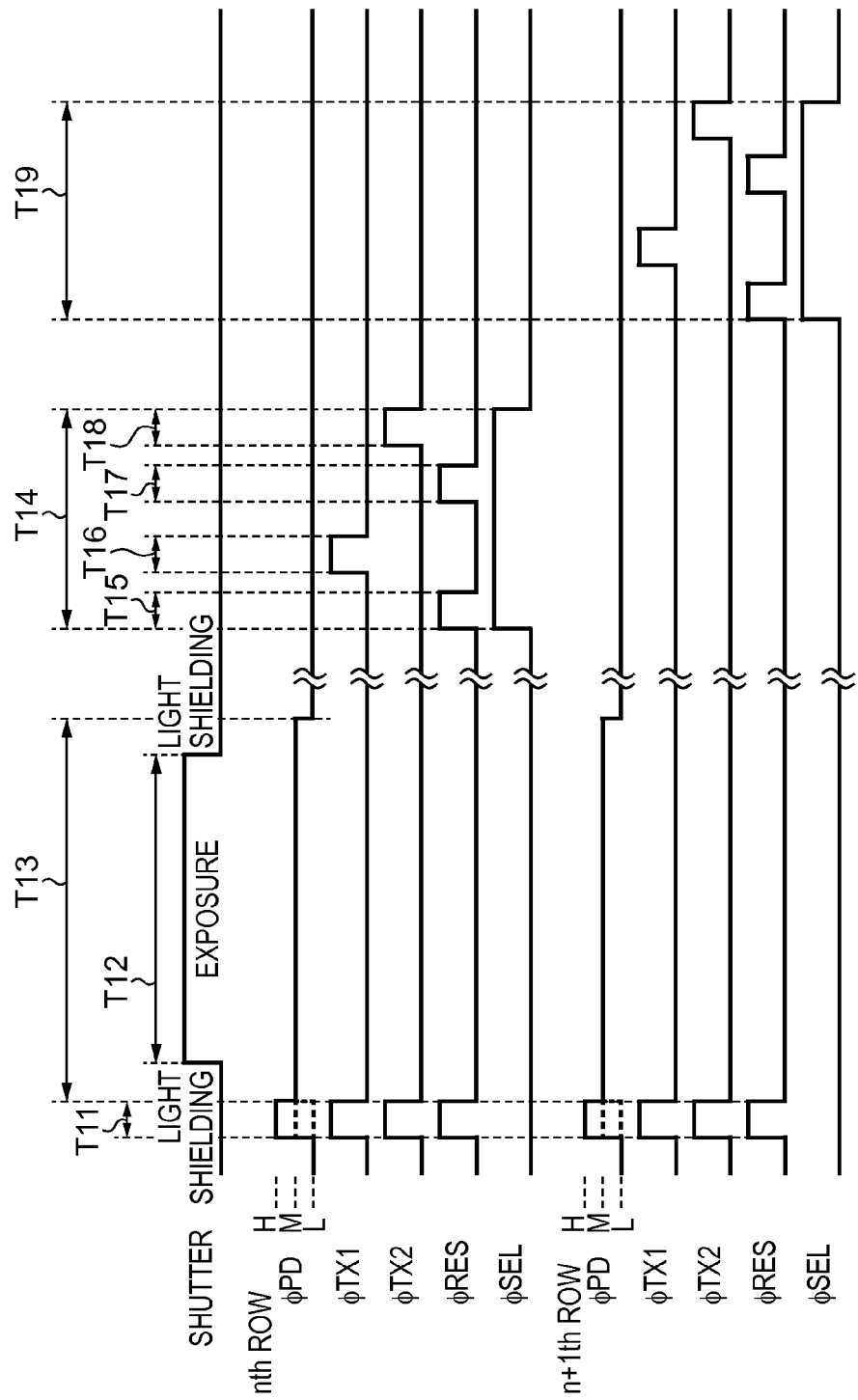
FIG. 10 is a timing chart showing an example of another driving method of the image sensor according to the embodiment.

Next, a driving method of the image sensor 100 of the present invention is described in detail using FIG. 8 to FIG. 10.

FIG. 8 is an equivalent circuit diagram that shows a configuration of one pixel of the pixel unit 101. Although only the single pixel 201 is shown in this case, other pixels constituting the pixel unit 101 have the same configuration as the pixel 201. Further, although only a readout circuit for one column is shown in FIG. 8, a plurality of readout circuits are provided to correspond to each column, and constitute the readout circuit 103.

As shown in FIG. 8, the PDs 203 and 204 in the pixel 201 are connected to the potential control switch 208. The potential control switch 208 is driven by a potential control signal fPD, and as described above, can control the height of the potential of the separation area 307 between the PD 203 and PD 204.

The transfer switches 205 and 206 are driven by transfer pulse signals fTX1 and fTX2, respectively. Signal charges generated at the PDs 203 and 204 are transferred to the readout region 207. A reset switch 801 is driven by a reset pulse signal fRES, and is configured to be capable of supplying a reset potential VDD to the readout region 207.

The readout region 207 holds charges that have been transferred from the PDs 203 and 204, and also functions as a charge/voltage conversion unit that converts a held charge into a voltage signal. The amplification unit 802 amplifies a voltage signal based on a charge that is held in the readout region 207, and outputs the amplified signal as a pixel signal. Here, as one example, a source follower circuit that uses a constant current source 804 and a MOS transistor is shown. A selection switch 803 is driven by a vertical selection pulse signal fSEL, and a signal amplified by the amplification unit 802 is output to a vertical output line 805. A signal output to the vertical output line 805 is read out to the readout circuit 103, and thereafter is further output to a circuit of a subsequent stage.

FIG. 9 is a timing chart that shows an example of a driving method of the image sensor 100 in the present embodiment. In FIG. 9, a driving method that uses a rolling shutter is shown. Note that, although driving signals for only a certain row ($n^{th}$ row) and the next row thereafter ($n+1^{th}$ row) are shown in FIG. 9, this driving is performed for each of the rows that are selected in turn by the vertical selection circuit 102 to read out signals from the pixel unit 101.

In FIG. 9, a period T1 is a reset period of the PD 203, in which a transfer pulse signal fTX1 and a reset pulse signal fRES are applied to reset the PD 203 to the reset potential VDD. A period T2 is a reset period of the PD 204, in which a transfer pulse signal fTX2 and a reset pulse signal fRES are applied to reset the PD 204 to the reset potential VDD. In this connection, in the example shown in FIG. 9, a voltage of M level is always applied with respect to fPD.

A period T3 is a charge accumulation period of the PD 203 of the $n^{th}$ row, and a period T4 is a charge accumulation period of the PD 204 of the $n^{th}$ row. In the charge accumulation periods T3 and T4, charges that have undergone photoelectric conversion in accordance with the respective amounts of light incident on the PDs 203 and 204 are accumulated. As described above, a voltage of M level is applied with respect to the potential control signal fPD, and the height of the potential of the separation area 307 between the PD 203 and the PD 204 is controlled so to enter a state (Vm) in which the potential is a little lower than the potential Vw of the separation area 305. By means of this control, when the respective PD outputs are acquired from the two PDs 203 and 204 of the same pixel and thereafter an image sensing signal is obtained by adding the aforementioned outputs from the two PDs 203 and 204, even if a PD on one side is saturated due to a difference in the sensitivity or the incident light amounts, an appropriate image sensing signal can be obtained. Further, when both of the PDs 203 and 204 are not saturated, signals obtained from the PDs 203 and 204, respectively, can be used as signals for focus detection by a phase difference detection method.

A period T5 is a readout period of the $n^{th}$ row, during which the vertical selection pulse signal fSEL is applied and signals are read out for each selected row. During the readout period T5, first, the reset pulse signal fRES is applied in a period T6 to reset the readout region 207 to the reset potential VDD. The reset potential of the readout region 207 is output to the readout circuit 103 through the vertical output line 805 and held by the readout circuit 103. Next, in a period T7, the transfer pulse signal φTX1 is applied, and a charge that has been accumulated in the PD 203 is transferred to the readout region 207. The signal potential of the PD 203 is output to the readout circuit 103 through the vertical output line 805 and held by the readout circuit 103. At the readout circuit 103, a difference between the reset potential and the signal potential is output as a signal of the PD 203.

Further, similarly to the periods T6 and T7, in a period T8 the reset potential of the readout region 207 is output to the readout circuit 103 and held thereby, and in a period T9 the signal potential of the PD 204 is output to the readout circuit 103 and held thereby. At the readout circuit 103, a difference between the reset potential and the signal potential is output as a signal of the PD 204.

A period T10 is a readout period of the $n+1^{th}$ row, in which a signal of each PD of each pixel of the $n+1^{th}$ row is output in a similar manner to the readout period T5.

FIG. 10 is a timing chart that shows another driving method of the image sensor 100 of the present invention. In FIG. 10, a driving method in a case in which a mechanical shutter is used is shown. Note that, although driving signals for only a certain row (n$^{th}$ row) and the next row thereafter (n+1$^{th}$ row) are shown in FIG. 10, this driving is performed for each of the rows that are selected in turn by the vertical selection circuit 102 to read out signals from the pixel unit 101.

In FIG. 10, a period T11 is a reset period during which transfer pulse signals fTX1 and fTX2, a reset pulse signal fRES, and a potential control signal fPD are applied to reset the PDs 203 and 204 to the reset potential VDD. Although FIG. 10 shows an example in which a H-level voltage is applied with respect to the potential control signal fPD during the period T11, a voltage applied with respect to the potential control signal fPD during this period may also be an M-level or L-level voltage.

A period T12 is a charge accumulation period. During this period, the image sensor 100 enters an exposure state as a result of the mechanical shutter opening, and a charge that has undergone photoelectric conversion in accordance with the amount of incident light is accumulated at the PDs 203 and 204, respectively. When the mechanical shutter is closed thereafter, the charge accumulation period ends. In a period T13, an M-level voltage is applied with respect to the potential control signal fPD, and the height of the potential of the separation area 307 between the PD 203 and the PD 204 is controlled so as to enter a state (Vm) in which the potential is a little lower than the potential Vw of the separation area 305. By means of this driving, when the respective PD outputs are acquired from the two PDs 203 and 204 of the same pixel and thereafter an image sensing signal is obtained by adding the aforementioned outputs from the two PDs 203 and 204, even if a PD on one side is saturated due to a difference in the sensitivity or the incident light amounts, an appropriate image sensing signal can be obtained. Further, when both of the PDs 203 and 204 are not saturated, signals obtained from the PDs 203 and 204, respectively, can be used as signals for focus detection.

After the period T13, readout scanning is performed for each row. At this time, an L-level voltage is applied with respect to the potential control signal fPD to thereby enable suppression of noise that is generated as a dark current.

A period T14 is a readout period of the n$^{th}$ row, during which the vertical selection pulse signal fSEL is applied and signals are read out for each selected row. During the readout period T14, first, the reset pulse signal fRES is applied in a period T15 to reset the readout region 207 to the reset potential VDD. The reset potential of the readout region 207 is output to the readout circuit 103 through the vertical output line 805, and held by the readout circuit 103. Next, in a period T16, the transfer pulse signal fTX1 is applied, and a charge that has been accumulated in the PD 203 is transferred to the readout region 207. Subsequently, the signal of the PD 203 is output to the readout circuit 103 through the vertical output line 805 and held by the readout circuit 103. At the readout circuit 103, a difference between the reset potential and the signal potential is output as a signal of the PD 203.

Further, similarly to the periods T15 and T16, in a period T17 the reset potential of the readout region 207 is output to the readout circuit 103 and held thereby, and in a period T18 the signal potential of the PD 204 is output to the readout circuit 103 and held thereby. At the readout circuit 103, a difference between the reset potential and the signal potential is output as a signal of the PD 204.

A period T19 is a readout period of the n+1$^{th}$ row, in which signals of the PDs of each pixel of the n+1$^{th}$ row are output in a similar manner to the readout period T14.

Figure 11:
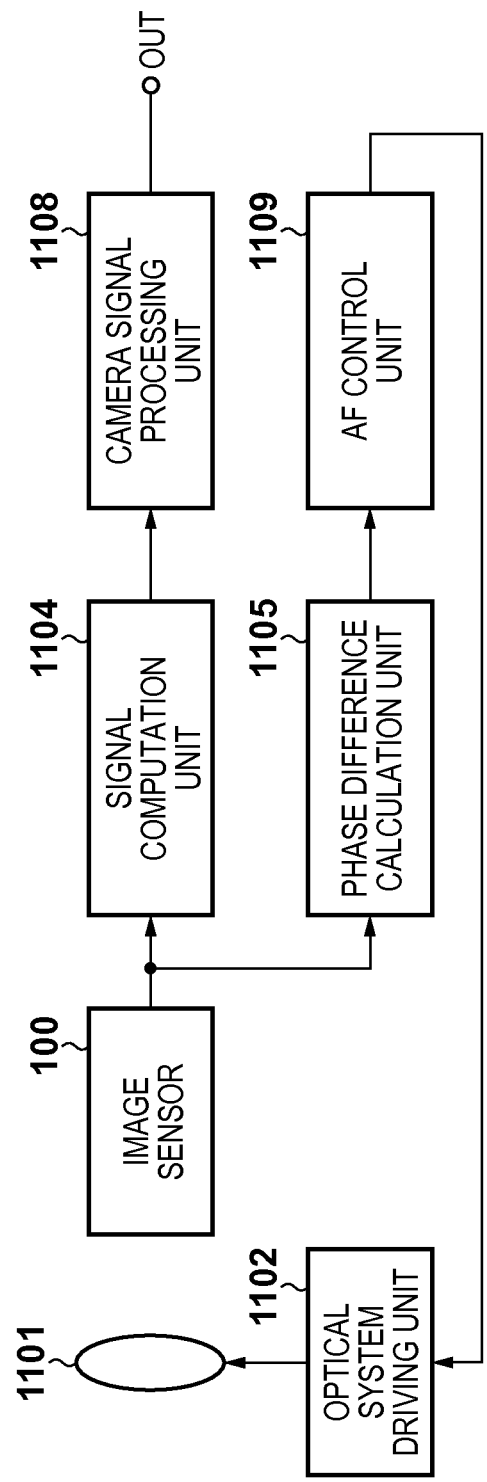
FIG. 11 is a block diagram showing a schematic configuration of an image sensing apparatus according to the embodiment.

FIG. 11 is a block diagram showing a schematic configuration of an image sensing apparatus having the aforementioned image sensor. In FIG. 11, reference numeral 1101 denotes an optical system that includes a focus lens as well as a zoom lens and an aperture and the like, and reference numeral 1102 denotes an optical system driving unit that controls the optical system 1101 by means of a control signal in accordance with optical system driving information that is output from an AF control unit 1109 that is described later.

Reference numeral 100 denotes the image sensor that is described above referring to FIG. 1 to FIG. 10. Reference numeral 1104 denotes a signal computation unit that executes arithmetic processing on signals output from each of the PDs 203 and 204 from the image sensor 100. The processing performed by the signal computation unit 1104 includes processing that adds the signals for each pixel to generate an image signal. Reference numeral 1108 denotes a camera signal processing unit that subjects an image signal obtained from the signal computation unit 1104 to image processing such as color conversion, white balance correction, and gamma correction, as well as resolution conversion processing and image compression processing and the like. The camera signal processing unit 1108 outputs the processed image signal to an unshown recording apparatus or display apparatus.

Reference numeral 1105 denotes a phase difference calculation unit that calculates a phase difference evaluation value for performing focusing by a phase difference detection method based on pupil-divided image signals that are output from the image sensor 100. Reference numeral 1109 denotes an AF control unit that calculates optical system driving information for controlling a focus lens position of the optical system 1101 based on a phase difference evaluation value calculated by the phase difference calculation unit 1105. More specifically, focusing control by a known phase difference detection method is performed by the phase difference calculation unit 1105 and the AF control unit 1109.

Next, imaging processing according to the present embodiment that is carried out by the image sensing apparatus shown in FIG. 11 is described with reference to the flowcharts in FIG. 12A and FIG. 12B.

Figure 12A:
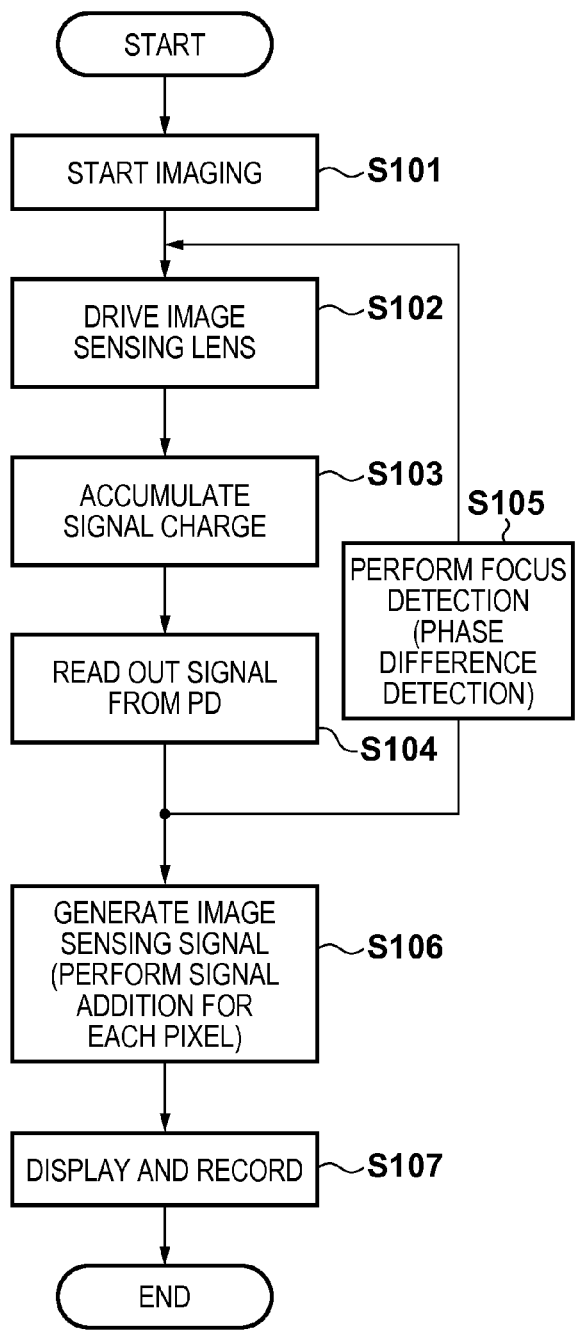
FIG. 12A and FIG. 12B are flowcharts showing a flow of an image sensing processing routine according to the embodiment.

FIG. 12A is a flowchart that shows the flow of processing for focus detection and image acquisition according to the present embodiment. In step S101, a user performs an operation to start imaging by operating an unshown release button or the like. In step S102, the optical system 1101 is driven to focus the lens on an object. However, the focus lens need not be driven the first time step S102 is executed immediately after imaging starts, since focus detection is not yet performed at that time and a driving amount of the focus lens cannot be acquired. Alternatively, the focus lens may be driven by a signal acquired from another focus detection unit that is not shown in the drawings.

In steps S103 and S104, the image sensor 100 is driven and charges are accumulated and read out in the manner described above referring to FIG. 9 or FIG. 10. More specifically, in step S103, the image sensor 100 receives light formed as an image by the optical system 1101, and a charge that is in accordance with the amount of incident light is accumulated at the PDs 203 and 204 of each pixel.

At this time, by applying an M-level voltage across the gate electrode 306 of the potential control switch 208, the potential of the relevant pixel enters the state shown in FIG. 5B. In step S104, the respective charges accumulated in the PDs 203 and 204 of each pixel are read out.

Next, in step S105, the phase difference calculation unit 1105 performs focus detection processing by a known phase difference detection method using the signals output from the PD 203 of each pixel and the signals output from the PD 204 of each pixel. In this case, according to the present embodiment, because an M-level voltage is applied across the gate electrode 306 of the potential control switch 208 during charge accumulation, there is the possibility that, depending on the pixel, one of the PDs will be saturated and an excess charge will leak into the other PD. In a state in which one of the PDs is saturated in this manner, that is, at the time of the state shown in FIG. 7B, a charge generated at the saturated PD mixes in with a signal of the other PD which is not saturated. Therefore, according to the present embodiment, a signal obtained from a pixel in which at least one PD is saturated is not used for focus detection processing because the reliability of the signal with respect to performing focus detection is low. Thus, in step S105, focus detection processing is performed using signals other than a signal obtained from a pixel in which at least one PD is saturated. Thereafter, in step S102, the focus lens is driven for imaging of the next frame in accordance with the phase difference detected in step S105.

In step S106, an image signal is generated by adding the signals that were read out from the PDs 203 and 204 for each pixel. According to the driving method of the image sensor 100 of the present embodiment, in the present step S106, when obtaining an image sensing signal by adding the outputs of the two PDs 203 and 204 of the same pixel, even if one of the PDs is saturated due to a difference in the sensitivity or the incident light amounts, an appropriate image sensing signal can be obtained.

Next, in step S107, processing to display the acquired image signal on a display unit of the image sensing apparatus and recording processing to record the image signal on a recording medium are performed, and thereafter the processing ends.

Thus, according to the present embodiment, a signal for focus detection that is obtained from the image sensor 100 can also be used as a signal for image sensing. That is, the operations to accumulate and read out the signal charges in steps S103 and S104 serve to both acquire signals for focus detection and to acquire signals for image sensing. Accordingly, the imaging processing according to the present embodiment is effective, in particular, in the case of a function in which display and recording at high speed are required while maintaining a focused state of an object, such as when performing sequential imaging of still images, live-view imaging, or video recording.

In the foregoing, a driving method has been described that enables both focus detection and image acquisition using signals from the image sensor 100. As another driving method using the image sensor 100, a method may be employed that drives the image sensing lens by means of a signal acquired from another focus detection unit. Alternatively, the user may perform focusing of the image sensing lens manually. That is, the image sensor of the present invention can also be driven specifically for acquiring a photographic image.

Figure 12B:
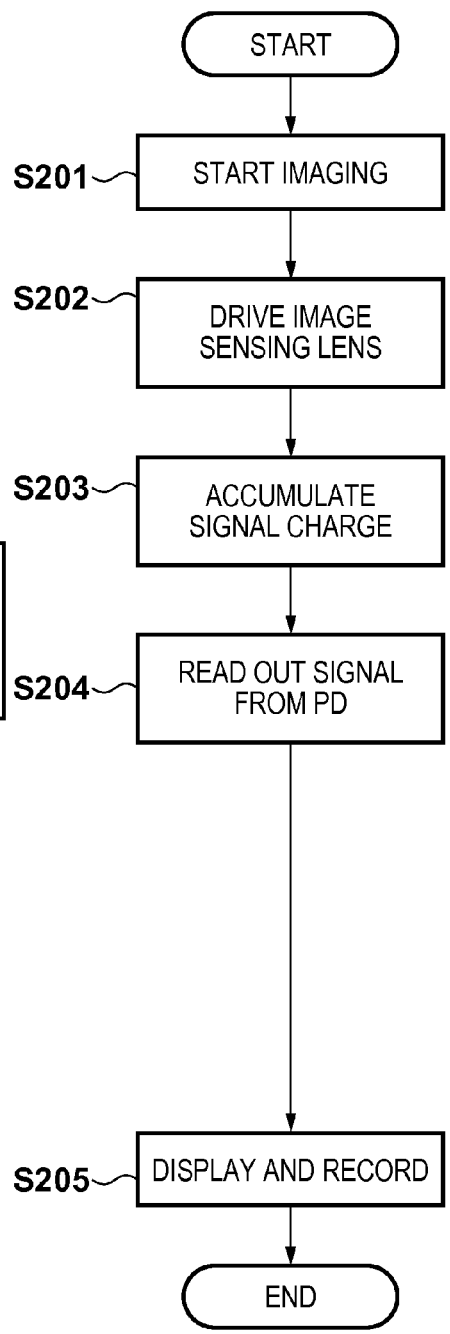
Figure 13A:
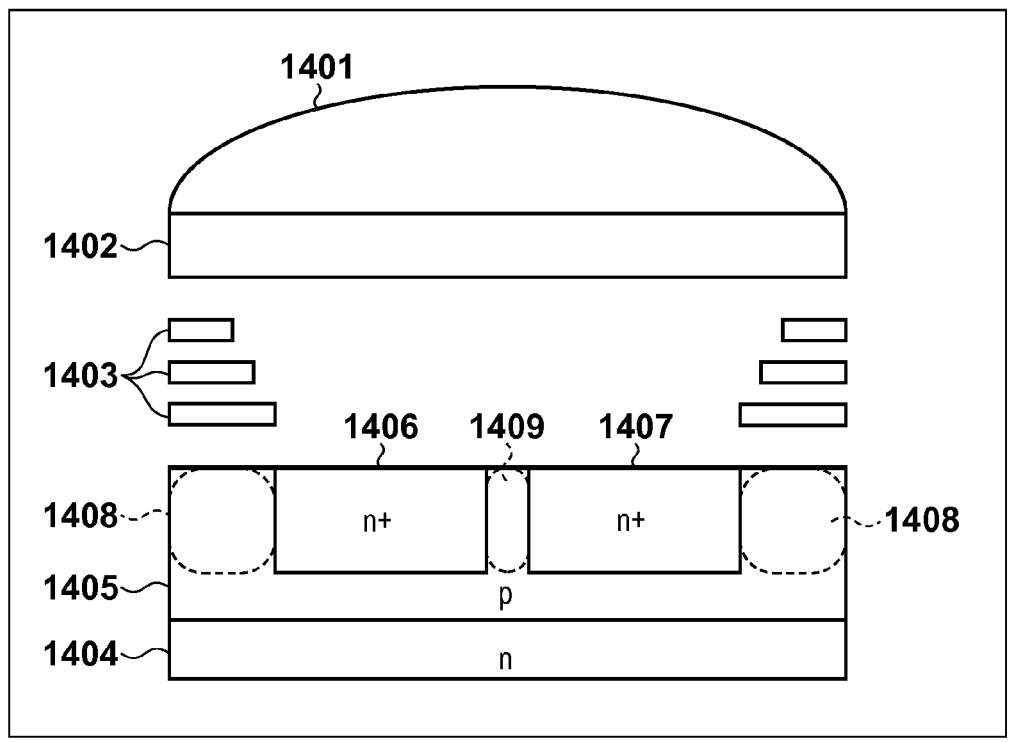
FIG. 13A and FIG. 13B are views that schematically show a cross-sectional configuration and a potential of a pixel of a conventional image sensor.
Figure 13B:
Figure 14:
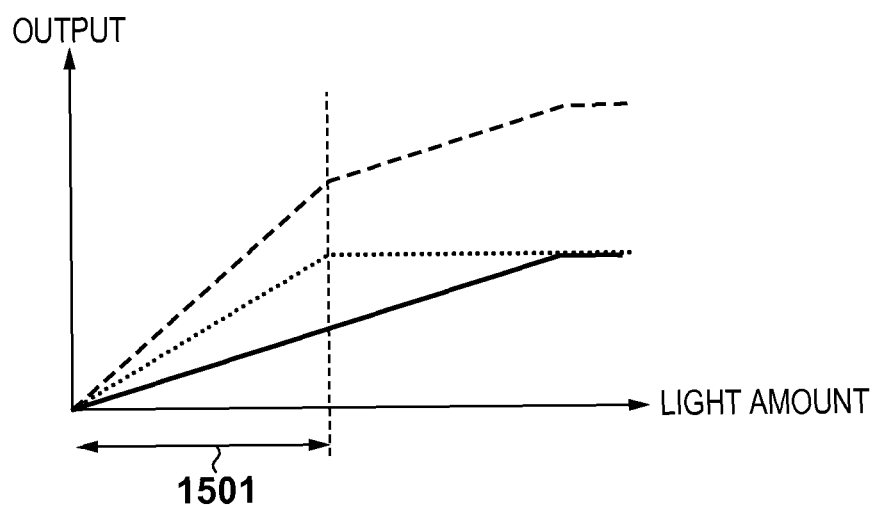
FIG. 14 is a view that schematically shows output characteristics, as well as an added output characteristic, of a plurality of photodiodes included in a single pixel in a conventional image sensor.

FIG. 12B is an example of a flowchart showing the flow of processing for focus detection by another focus detection unit and for acquiring a photographic image in an image sensing apparatus that uses the image sensor of the present invention. In step S201, a user performs an operation to start imaging by operating an unshown release button or the like. In step S202, the focus lens is driven based on a signal acquired from another focus detection unit that is not shown in the drawings. Alternatively, in a case where focusing is performed manually by the user, the lens need not be driven.

In step S203, the image sensor 100 receives light formed as an image by the optical system 1101, and a charge that is in accordance with the amount of incident light is accumulated at the PDs 203 and 204 of each pixel. At this time, by applying a H-level voltage across the gate electrode 306 of the potential control switch 208, the potential of the relevant pixel enters the state shown in FIG. 4B. In a state in which the potential of the pixel is as shown in FIG. 4B, a charge is also accumulated in the separation area 307 that is the semiconductor layer below the gate electrode 306, and hence a charge amount that can be accumulated per pixel is greater than in the potential structure shown in FIG. 5B. That is, in the case of a driving method that uses the image sensor 100 of the present invention specifically for acquiring a photographic image, by applying a H-level voltage across the gate electrode 306 during a charge accumulation period, it is possible to acquire a more favorable photographic image in comparison to the driving method shown in FIG. 12A.

In step S204, charges that have been accumulated in the PDs 203 and 204 are read out. In this case, since the PDs 203 and 204 are coupled for each pixel, in step S204 an image signal is read out directly from the PDs for each pixel, and hence it is not necessary to add the signals of the PDs 203 and 204 for each pixel. Subsequently, in step S205, processing to display the acquired image signals on the display unit and recording processing to record the image signals on a recording medium are performed.

Although preferred embodiments of the present invention have been described in the foregoing, the present invention is not limited to these embodiments, and various modifications and changes are possible within the scope and sprit of the present invention.

For example, although the potential control switch 208 constituted by the gate electrode 306 in the aforementioned embodiment is a MOS transistor, a configuration may also be adopted in which the potential control switch 208 is a junction field effect transistor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-176333, filed on Aug. 11, 2011 which is hereby incorporated by reference herein in its entirety.

The invention claimed is:

1. An image sensor comprising a plurality of pixels, each pixel having:
   a plurality of photoelectric conversion units configured to receive a plurality of light fluxes that pass through different exit pupil regions of an optical system that is disposed on an object side of said image sensor and accumulate charges, respectively;
   a separation portion configured to separate said plurality of photoelectric conversion units; and
   a setting unit configured to selectively set an electric potential of said separation portion to any one of a plurality of electric potentials,
   wherein:
   signals in accordance with accumulated charges can be separately read out from said plurality of photoelectric conversion units; and
   when an electric potential of a separation portion that separates said plurality of pixels is taken as a reference potential, the plurality of electric potentials include a first electric potential that is higher than the reference potential, a second electric potential that is lower than the reference potential, and a third electric potential that is higher than the reference potential and lower than the first electric potential.

2. The image sensor according to claim 1, wherein said setting unit sets to the first electric potential during resetting of said plurality of photoelectric conversion units, sets to the third electric potential during a period of accumulating a charge in said plurality of photoelectric conversion units, and sets to the second electric potential during a period of reading out signals from said plurality of photoelectric conversion units.

3. The image sensor according to claim 1, wherein said setting unit sets to the first electric potential during a period of accumulating a charge in said plurality of photoelectric conversion units.

4. An image sensor comprising a plurality of pixels, each pixel having:
 a plurality of photoelectric conversion units configured to receive a plurality of light fluxes that pass through different exit pupil regions of an optical system disposed on an object side of said image sensor and accumulate charges, respectively;
 a first separation portion configured to separate said plurality of photoelectric conversion units; and
 a second separation portion configured to separate the respective pixels from a pixel adjacent to the relevant pixel,
 wherein:
 an electric potential of the first separation portion is higher than an electric potential of the second separation portion and is lower than a reset potential of said plurality of photoelectric conversion units; and
 signals in accordance with accumulated charges can be separately read out from said plurality of photoelectric conversion units.

5. An image sensing apparatus, comprising:
 an image sensor according to claim 1; and
 a focus detection unit configured to perform focus detection by a phase difference detection method using signals that are based on charges that are separately read out from said plurality of photoelectric conversion units,
 wherein when at least any one of said plurality of photoelectric conversion units is saturated, said focus detection unit does not use signals that are read out from a plurality of photoelectric conversion units of a pixel that includes the saturated photoelectric conversion unit for the focus detection.

6. The image sensing apparatus according to claim 5, further comprising a generation unit that adds signals that are read out from said plurality of photoelectric conversion units for each pixel, and generates an image signal.

* * * * *